United States Patent

Koyanagi et al.

[11] Patent Number: 5,951,779
[45] Date of Patent: Sep. 14, 1999

[54] TREATMENT METHOD OF SEMICONDUCTOR WAFERS AND THE LIKE AND TREATMENT SYSTEM FOR THE SAME

[75] Inventors: Tetsuo Koyanagi; Hiroshi Yamaguchi; Ichio Yokota; Naofumi Mitsumune; Koichi Tange, all of Kyoto-fu, Japan

[73] Assignee: Ses Co., Ltd., Tokyo, Japan

[21] Appl. No.: 08/986,544

[22] Filed: Dec. 8, 1997

[30] Foreign Application Priority Data

Jul. 9, 1997 [JP] Japan .................................. 9-183795

[51] Int. Cl.$^6$ .............................. B08B 5/04; B08B 3/00; B08B 5/00; B08B 1/02
[52] U.S. Cl. ............................... 134/2; 134/21; 134/95.2; 134/902; 134/30; 134/31; 134/32
[58] Field of Search .................................. 134/1, 11, 18, 134/21, 95.2, 104.1, 135, 902, 30, 31, 32; 34/92, 406; 118/668; 156/344

[56] References Cited

U.S. PATENT DOCUMENTS

| | | | |
|---|---|---|---|
| 4,984,597 | 1/1991 | McConnell et al. | 134/95 |
| 5,191,908 | 3/1993 | Hiroe et al. | 134/76 |
| 5,275,184 | 1/1994 | Nishizawa et al. | 134/57 R |
| 5,443,540 | 8/1995 | Kamikawa | 34/471 |
| 5,464,480 | 11/1995 | Matthews | 134/1.3 |
| 5,520,744 | 5/1996 | Fujikawa et al. | 134/11 |
| 5,540,245 | 7/1996 | Munakata et al. | 134/76 |
| 5,569,330 | 10/1996 | Schild et al. | 134/1 |
| 5,575,079 | 11/1996 | Yokomizo et al. | 34/78 |
| 5,660,642 | 8/1997 | Britten | 134/30 |
| 5,714,203 | 2/1998 | Schellenberger et al. | 427/378 |
| 5,752,532 | 5/1998 | Schwenkler | 134/102.3 |
| 5,807,439 | 9/1998 | Akatsu et al. | 134/32 |
| 5,878,760 | 3/1999 | Mohindra et al. | 134/95.2 |

FOREIGN PATENT DOCUMENTS

| | | |
|---|---|---|
| 0385536 A1 | 9/1990 | European Pat. Off. . |
| 62-136825 | 6/1987 | Japan . |
| 7-130699 | 5/1995 | Japan . |

Primary Examiner—Jill Warden
Assistant Examiner—Yolanda E. Wilkins
Attorney, Agent, or Firm—Darby & Darby

[57] ABSTRACT

A treatment method of semiconductor wafers and the like, for carrying out step by step in a sealed container, a series of processes comprising chemical process with a cleaning chemical (chemical process) and final water rinsing process by using rinsing pure water (rinse process) and a drying process of removing attached water from the surface of an object through mixing substitution using an organic solvent, and a treatment system for the same, wherein warm pure water is fed into the sealed container after the final water rinsing process of the cleaning process is completed. The vapor or fog of the organic solvent is fed into the space procured on the upper side of the container upward the water surface of pure warm water, where the object as placed vertically in parallel arrangement is immersed and sunk. After the upper space is filled with the organic solvent, inert gas is fed into the container, while the warm pure water is discharged under aspiration from the bottom side of the container at a state such that the feeding of the organic solvent is stopped.

8 Claims, 10 Drawing Sheets

TREATMENT METHOD OF SEMICONDUCTOR WAFERS AND THE LIKE AND TREATMENT SYSTEM FOR THE SAME

BACKGROUND OF THE INVENTION

1. Field of the Invention

The present invention relates to a treatment method of semiconductor wafers and the like and a treatment system for the same; more specifically, the present invention relates to a treatment method of semiconductor wafers and the like, comprising a series of cleaning processes including a chemical process for removing dust, organic residues and inorganic residues or the like from surfaces of solid objects such as semiconductor silicon wafer, liquid crystal board and masking board by using several types of cleaning chemicals and a subsequent final water rinsing process (rinsing process) for rinsing off the cleaning chemicals from the object surface by using rinsing pure water, and a drying process of removing the rinsing pure water attached on the object surface, namely attached water (water drops) after completion of the final water rinsing process of the cleaning process, wherein these processes are carried out step by step in a sealed container. More specifically, the present invention relates to the improvement of a vapor treatment method and a treatment system for the same, wherein the removal of the attached water on the surface of the object is carried out at a drying process of mixing substitution using an organic solvent comprising a material readily mixable with the attached water and having a lower surface tension, for example IPA (isopropyl alcohol).

2. Description of the Background Art

A variety of processes have been developed and proposed, conventionally, as a vapor treatment method comprising a series of cleaning processes from a chemical process for removing dust, organic residues or inorganic residues from the surface of the object by using several types of cleaning chemicals to a final water rinsing process for rinsing off the chemicals from the surfaces of the objects by using rinsing pure water, and a drying process of removing the attached water on the surfaces of the objects through mixing substitution with the vapor of an organic solvent, for example IPA (isopropyl alcohol), wherein these processes are carried out in a sealed container.

For example, these processes have been known, as described in published gazettes such as Japanese Patent Laid-open No. Sho 62-136825 (referred to as former, hereinbelow) and Japanese Patent Laid-open No. Hei 7-130699 (referred to as latter, hereinbelow).

According to the former vapor treatment process, however, an organic solvent in vapor is supplied from the top of a container into the container while rinsing pure water is pushed downward, to push out the water from the bottom of the container on completion of a series of rinsing processes. In other words, a pressure required to continuously supply an organic solvent vapor and to push down rinsing pure water and discharge the water from the bottom side of the container should be loaded appropriately, until the rinsing pure water is totally pushed down and discharged outside of the container. Because the former requires a vast amount of an organic solvent should be fed into the container per one drying process (per one cycle process), therefore, the former is disadvantageous and uneconomical from the respect of the cost. Because the organic solvent vapor should be fed into the container under a pressure required to push out rinsing pure water in the container, a gas pressuring means such as pump is essential.

According to the latter vapor treatment method, on contrast, the feeding of an organic solvent vapor into a sealed chamber is initiated, simultaneously when a object is drawn up from pure water in a rinsing tank, into the sealed chamber which is enclosing the rinsing tank, after the final water rinsing process of the cleaning process is performed in the rinsing tank fed with rinsing pure water, thereby condensation of the organic solvent vapor occurs on the surface of the object and the attached water is substituted with the organic solvent. In other words, the supply of the organic solvent vapor into the sealed chamber should be continued, at least until the object is completely drawn up from the pure water and the inside of the large sealed chamber is filled with the organic solvent vapor. Thus, like the former, the latter requires a vast amount of an organic solvent to be continuously supplied per drying process (per one cycle process), so that the latter is also costly and uneconomical.

SUMMARY OF THE INVENTION

The present inventors have therefore made various investigations. Consequently, the inventors have focused their attention to the fact that a part of an organic solvent fed into such container is condensed on the water surface, thereby forming a mixture layer of an appropriate thickness on the water surface, starting from the surface of the object toward the water surface; and that the concentration of the organic solvent in the mixture layer is lower on the side in contact to the water surface than on the side in contact to the object surface, which leads to the gradient of surface tension, and causes a liquid current from the object surface to the water surface. Thus, the inventors have achieved the present invention.

It is a purpose of the present invention to provide a treatment method and a system for semiconductor wafers and the like, capable of prominently reducing the use of an organic solvent per drying process (per one cycle process) at the vapor drying process of using an organic solvent.

It is another purpose of the present invention to provide a treatment method and system for semiconductor wafers and the like and capable of effectively and securely removing attached water from the surface of the object through the gradient of surface tension in addition to the mixing substitution with the organic solvent.

A still further purpose will be apparent in the detailed description and the drawings below.

These purposes can be attained by the treatment method and system for semiconductor wafers and the like in accordance with the present invention.

The treatment method of the present invention for semiconductor wafers and the like is including a series of processes from a cleaning process of an object to a drying process thereof in a sealed container and comprising a process of feeding warm pure water into the container where a plurality of sheets of the object are transferred and placed vertically in parallel arrangement, after the final water rinsing process of the cleaning process is completed, a process of feeding an organic solvent in vapor or fog at least into the upper space procured upward the fluid surface of the warm pure water in the container, a process of continuously feeding inert gas from the upper side of the container while the warm pure water is discharged under aspiration from the bottom side of the container after the supply of the organic solvent is terminated, and a process of drying the object comprising continuously reducing the pressure inside the container under aspiration, wherein the drying process of the object should be carried out under controls and regulations so that the pressure reduction in the container might be maintained at a preset pressure reduction degree at least until the process of discharging the warm pure water from the bottom side of the container is completed.

The treatment system described above is characterized in that the water temperature of the warm pure water during feeding into the container is within a range of 30 to 65° C.; the preset pressure reduction degree in the container is within a range of −350 mmHg to −50 mmHg until the completion of the discharge of the warm pure water under aspiration to the outside of the container; preferably, the water temperature of the warm pure water is within a range of 40 to 50° C.; the pressure reduction degree in the container is preset within a range of −300 mmHg to −150 mmHg. The treatment system described above is characterized particularly in that the water temperature of the warm pure water is 45° C. and the pressure reduction degree in the container is preset at −240 mmHg.

The treatment method described above is characterized in that the inside of the container is gas discharged under aspiration while feeding an organic solvent into the container. More specifically, the feeding of an organic solvent is continued, at least until the upper space inside the container is filled with the organic solvent. In other words, the feeding should be continued, until the organic solvent reaches all the exposed sheets of the object following the lowering of the fluid surface caused by the discharge of the warm pure water under aspiration.

The treatment method of the present invention is for semiconductor wafers and the like, including a series of processes from a cleaning process to a drying process in a sealed container, wherein a water rinsing process of the cleaning process is carried out at a state such that the feeding of inert gas into a container is initiated after a plurality of sheets of the object are transferred and placed vertically in parallel arrangement, and continued at least until the drying process is completed.

According to the treatment method of the present invention, hence, warm pure water within a range of 30 to 65° C. is fed to a water level enough to immerse and sink the object in a container after a series of cleaning processes from the chemical process to the final water rinsing process are completed, whereby the object is heated to a necessary temperature around 30 to 65° C. through the thermal energy of the warm pure water, which promotes drying at the drying process. Then, at a process of feeding an organic solvent in vapor or fog at least into the upper space procured upward the fluid surface of the warm pure water in the container, the pressure reduction in the container is maintained at a preset pressure reduction degree within a range of −350 mmHg to −50 mmHg until the discharge of the warm pure water under aspiration is completed, whereby the vapor or fog of the organic solvent fed into the container is condensed on the surface of the warm pure water to form a mixture solution layer, and alternatively, the vaporization or fogging is maintained, through the atmosphere inside the container under reduced pressure as maintained at a preset pressure reduction degree and through the thermal energy of the warm pure water, so that the vapor or fog is condensed on the surface of the exposed object following the lowering of the surface of the warm pure water, to be mixed and substituted with the attached water on the surface, and the attached water flows over the object surface in drops, together with the mixture solution of the attached water with the organic solvent, and is then removed from the object surface via the liquid current from the object surface toward the warm pure water surface, which current is developed in the mixture solution layer. More specifically, the object is dried, owing to the following two actions; the substitution action of mixing with the organic solvent and the action of liquid current developing in the mixture solution layer, which works to convey the attached water from the object surface toward the warm pure water surface. Then, the organic solvent is again vaporized from the mixture solution layer around the object, due to the atmosphere inside the container under reduced pressure which is maintained at a preset pressure reduction degree and due to the thermal energy of the warm pure water, so that the aforementioned condensation on the subject surface is repeatedly continued.

At a process of feeding the vapor or fog of the organic solvent into the upper space of the container while evacuating the container under aspiration, the vapor or fog of the organic solvent is smoothly introduced into the upper space of the container, whereby the upper space is filled with the organic solvent in a very short time. Thus, the transfer to subsequent processes smoothly progresses. Additionally, the organic solvent is vaporized at a temperature lower than the boiling point at atmospheric pressure (ambient pressure), because the pressure inside the container is appropriately reduced through evacuating under aspiration, whereby a solvent (vapor) atmosphere can be prepared in the upper space at a lower temperature.

The treatment system of the present invention is applied to semiconductor wafers and the like, which can carry out a series of cleaning processes including a drying process in a sealed container, comprising a container in a box form with a bottom and with an upper opening and of a size such that a plurality of sheets of the object can be transferred and placed vertically in parallel arrangement, and additionally with a sealing lid freely opening and closing on the upper opening; a liquid feeding means connected to the bottom side of the container to feed chemicals and pure water through a liquid feeding conduit into the container at least to a liquid level enough to immerse and sink the object by opening a chemical valve and a pure water valve, depending on each treatment stage from the cleaning process to the drying process and to feed warm pure water to the same level through a liquid feeding conduit by opening a warm pure water valve after completion of the rinsing process; a liquid discharging means connected at least to the liquid feeding means and the upper side of the container or the bottom side thereof, for liquid discharge under aspiration of the chemicals, pure water and warm pure water through a liquid discharge conduit by opening a liquid discharge valve from the container, depending on each treatment stage; a solvent feeding means connected to the upper side of the container to feed the vapor or fog of an organic solvent through a solvent feeding conduit into the container by opening a solvent valve; a gas feeding means connected to the upper side of the container to feed inert gas through a gas feeding conduit into the container by opening a gas valve; a detecting means mounted on the upper side of the container, to detect the pressure reduction in the container during the treatment stage for liquid discharge of warm pure water through the liquid discharge conduit connected to the bottom side of the container; a control means connected and arranged between the detecting means and the liquid discharge means or the gas feeding means, to perform a comparison process of the newly recovered pressure reduction output from the detecting means with the preset pressure reduction value and thereafter control the liquid discharge rate or the gas feeding rate on the basis of the process information, so that the pressure reduction in the container might be maintained at the preset pressure reduction value, until the liquid discharge of the warm pure water under aspiration is completed.

The treatment system described above is characterized in that the water temperature of the warm pure water during feeding into the container is within a range of 30 to 65° C.; and that the preset pressure reduction value in the container is within a range of −350 mmHg to −50 mmHg, until the completion of discharging the warm pure water under aspiration to the outside of the container; preferably, the water temperature of the warm pure water is within a range of 40 to 50° C.; and the pressure reduction in the container is preset within a range of −300 mmHg to −150 mmHg. The treatment system is characterized particularly in that the water temperature of the warm pure water is 45° C. and the pressure reduction in the container is preset at −240 mmHg.

Accordingly, after transferring and placing a plurality of sheets of the object vertically in parallel arrangement from the upper opening into the container and closing then the upper opening with a sealing lid, the chemical valve, the pure water valve and the warm pure water valve at a water temperature within a range of 30 to 65° C. are serially opened (in the serial order) depending on each treatment stage. Subsequently, the chemicals and pure water, and warm pure water are fed from the bottom side of the container through the liquid feeding conduit of the liquid feeding means into the container, to a final liquid level such that the object might be immersed and sunk therein, depending on each process stage from the cleaning process to the drying process, whereby an ascending liquid current of the chemicals and pure water, and warm pure water, flowing in contact to the subject surface, is formed in the container, for performing the treatment depending on each process stage. Then, the liquid discharge valve of the liquid discharge means connected to the upper side of the container is opened, so that excess chemicals and pure water, and warm pure water are discharged to the outside of the container under aspiration through the liquid discharge conduit.

On termination of the aforementioned processes, then, the solvent valve of the solvent feeding means is opened to feed the organic solvent in vapor or fog through the solvent feeding conduit at least into the upper space procured upward the surface of the warm pure water in the container. The feeding is continued until the upper space in the container is filled with the organic solvent in vapor or fog. By continuous aspirating the inside of the container by the liquid discharge means connected to the upper side of the container, then, the pressure inside the container is appropriately reduced, so that the organic solvent atmosphere is rapidly formed in the upper space in a short time. Because the pressure is also appropriately reduced in the solvent feeding means directly connected to the container, for example the inside of a vapor generation unit, following the pressure reduction in the container, the organic solvent is vaporized at a temperature lower than the boiling point at atmospheric pressure (ambient pressure) and is fed through the solvent feeding conduit into the container, so that a solvent atmosphere of such low temperature is formed in the container;

When the upper space in the container is filled with the organic solvent, the solvent valve is closed, while the liquid discharge valve of the liquid discharge means connected to the bottom side of the container is opened. Subsequently, the warm pure water in the container, passing through the liquid discharge conduit, is discharged under aspiration from the bottom side of the container to the outside of the container. Then, the pressure reduction in the container following the discharge of the warm pure water under aspiration is detected by the detecting means, and serially output to a control means, which performs the process of comparison between the current pressure reduction value in the container, which is detected by the detecting means, and the preset pressure reduction value within a range of −350 to −50 mmHg. Based on the process information, the discharge rate of the warm pure water through the liquid discharge means or the feeding rate of inert gas through a gas feeding means are adjusted and modified by the control means, whereby the inside of the container is maintained at the preset pressure reduction degree until the discharge of the warm pure water under aspiration is completed. More specifically, a part of the vapor or fog of the organic solvent fed into the container is condensed on the surface of the warm pure water to form a mixture solution layer on the fluid surface, while the vaporization or fogging is maintained in the container under the atmosphere of reduced pressure maintained at the preset pressure reduction via the thermal energy of the warm pure water, whereby the vapor or fog is condensed on the surface of the exposed object as the liquid surface of the warm pure water is lowered, for substitution with the attached water on the subject surface. The attached water flows in drops over the surface of the object, together with the mixture solution of the attached water with the organic solvent, and the attached water is then removed from the object surface via the liquid current developing in the mixture solution layer from the surface of the object toward the water surface of the warm pure water. In other words, the object is dried through two actions, namely substitution action due to the mixing with the organic solvent and liquid current action developing in the mixture solution layer, which works to convey the attached water from the object surface toward the water surface of the warm pure water. Then, the organic solvent is again vaporized from the mixture solution layer around the exposed object, due to the atmosphere under reduced pressure and the thermal energy of the warm pure water, for repetitive condensation on the object surface.

After the warm pure water in the container is totally discharged under aspiration, then, the pressure inside of the container is kept reduced under continuous aspiration, in order to discharge all of the organic solvent, the mixture solution with the solvent, moisture and the like remaining in the container, to the outside the container. Subsequently, the inside of the container resumes atmospheric pressure (ambient pressure) due to inert gas fed from the upper side of the container into the container, followed by opening of the sealing lid and transferring of the object from the inside of the container to the outside thereof, whereby a series of processes from the cleaning process to the drying process are completed.

DETAILED DESCRIPTION OF THE INVENTION

Specific embodiments of the present invention will be described with reference to drawings.

Figure 1:
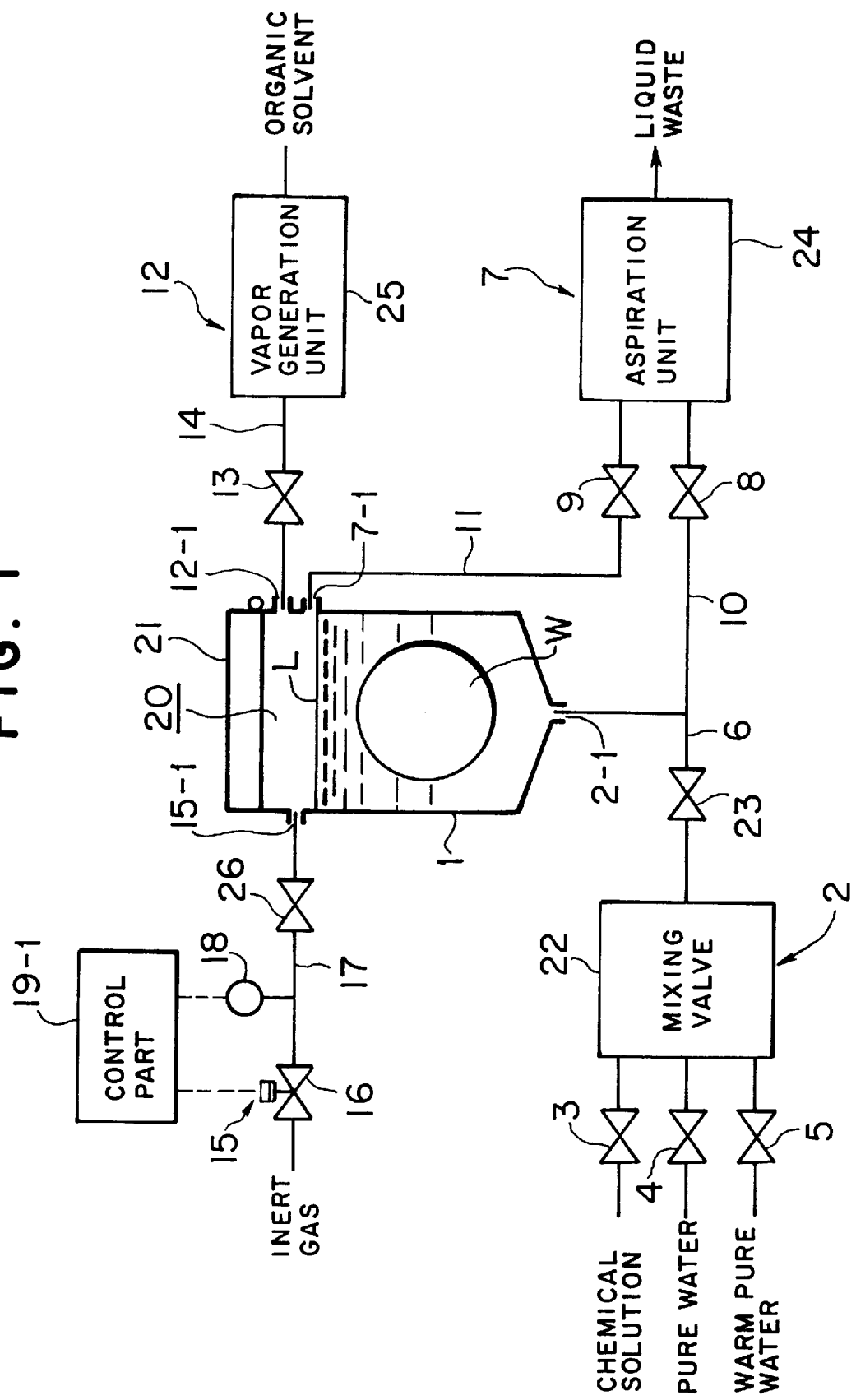
FIG. 1 is a schematic view depicting one example of the treatment system carrying out the treatment method of semiconductor wafers and the like in accordance with the present invention.
Figure 2:
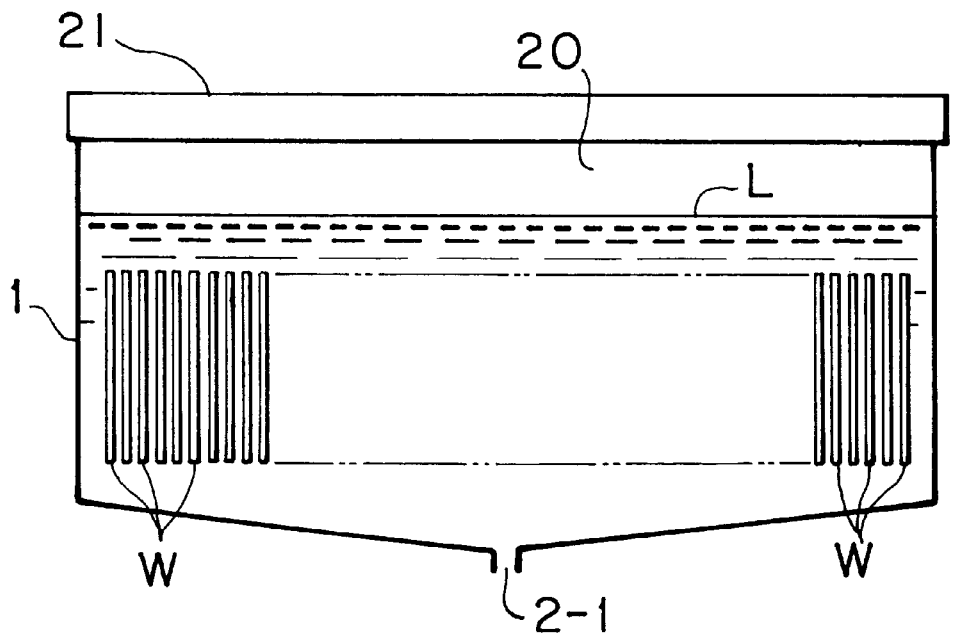
FIG. 2 is a schematic longitudinal view of the container.

FIG. 1 is a schematic view depicting one example of the treatment system carrying out the treatment method of semiconductor wafers and the like in accordance with the present invention, wherein 1 represents sealed container which can be opened and closed; 2 represents liquid feeding means feeding several types of chemicals, pure water, and warm pure water, into the container to a liquid level enough to immerse and sink object W therein, through liquid feeding conduit 6 connected to the bottom side of the container 1 and through the chemical valve 3, pure water valve 4, or warm pure water valve 5 described below, depending on each process stage from cleaning process to drying process; 7 represents liquid discharge means individually connected to the liquid feeding conduit 6 of the liquid feeding means 2 and to the upper side of the container 1, to discharge chemicals, pure water and warm pure water from the inside of the container 1, through the liquid discharge conduits 10 or 11, on opening of the liquid discharge valves 8 or 9 described below; 12 represents solvent feeding means connected to the upper side of the container 1, feeding the vapor or fog of the organic solvent into the container 1, through the solvent feeding conduit 14, on valve opening of solvent valve 13, depending on each process stage; 15 represents gas feeding means connected to the upper side of the container 1 for feeding inert gas through gas feeding conduit 17 into the inside of the container 1 by valve opening of the gas valve 16 described below; 18 represents detection means mounted on the upper side of the container 1 for detecting the pressure inside the container 1; 19 represents control means adjusting the inert gas feeding rate of the gas feeding means 15 on the basis of the detected signal output from the detecting means 18, and the system is configured such that the series of processes from the cleaning process of the object W to the drying process thereof is carried out in the sealed container 1 via the operation of these individual means 2, 7, 12, 15, 18 and 19.

The container 1 is in the form of a box with a bottom and with an upper opening, which is approximately of a size (in a shape with an opening) such that a great number of sheets of the object W are supported and placed at their vertical state in a parallel manner at a given interval and approximately of a depth such that the object W can be immersed and sunk and upper space 20 of an appropriate volume can be procured to feed inert gas into the upper side, and sealing lid 21 is provided in a freely opening and closing manner on the upper opening to seal the container 1 after the object W is transferred and placed therein. Then, liquid feeding conduit 6 of liquid feeding means 2 is connected to the bottom side, while liquid discharge conduit 11 of the liquid discharge means 7, feeding conduit 14 of the solvent feeding means 12 and feeding conduit 17 of the gas feeding means 15 are individually connected to the upper side.

Not shown in the figure, a supporting means supporting the lower halves of a great number of sheets of the object W is equipped in the container 1, whereby a great number of sheets of the object W can be placed vertically in parallel arrangement at an appropriate interval.

Correspondingly to each process stage of the cleaning process of the object W, liquid feeding means 2 functions to feed several types of chemicals and pure water into the container 1, and to feed warm pure water from liquid feeding opening 2-1 into the container 1 at the preparation stage of the drying process of the object W, wherein the liquid feeding conduit 6 is connected to the liquid feeding opening 2-1 which opens at the bottom center of the container 1, the bottom being slanting toward the center, and to the liquid feeding conduit 6 are connected chemical valve 3, pure water valve 4 and warm pure water valve 5, through mixing valve 22, while general valve 23 of the individual valves 3, 4 and 5 is connected between the mixing valve 22 and the liquid feeding opening 2-1, and the chemicals, pure water and warm pure water are continuously fed into the container 1 through valve opening of the general valve 23 and valve opening of the individual valves 3, 4 or 5, corresponding to each process stage from the cleaning process to the drying process.

The liquid discharge means 7 discharges excess chemicals and pure water and the like from the upper side of the container 1 to the outside of the container 1, during the cleaning process of the object W. More specifically, the liquid discharge means 7 serves a role of liquid discharge, under aspiration, of the over-flow water contaminated with dust, organic residues or inorganic residues removed from the surface of the object W, from the upper side of the container 1 to the outside of the container 1, a role of liquid discharge, under aspiration, of warm pure water fed into the container 1 to promote drying of the object W, from the bottom side of the container 1 to the outside of the container 1 at the drying process of the object W, and a role of gas discharge, under aspiration, of the organic solvent and moisture and the like left in the container 1 to the outside of the container 1 by continuous operation of the liquid discharge means 7 after the completion of the liquid discharge of warm pure water; the liquid discharge means comprises liquid discharge conduit 10 branched from the liquid feeding conduit 6 and additionally comprises liquid discharge conduit 11 connected to liquid discharge opening 7-1 opened at the upper side of the container 1, which locates at the height of the liquid surface L enough to immerse and sink the object W, wherein the individual liquid discharge conduits 10, 11 are provided with liquid discharge valves 8, 9 and connected to aspiration unit 24 and wherein excess chemicals and pure water are enforced to be discharged under aspiration through the liquid discharge opening 7-1 on the upper side of the container 1 to the outside of the container 1 by the opening of the liquid discharge valve 9; and wherein warm pure water is enforced to be discharged, under aspiration, through the liquid discharge conduit 10 from the liquid feeding opening 2-1 on the bottom of the container 1 to the outside of the container 1. In other words, the liquid feeding opening 2-1 on the bottom serves its essential role of feeding chemicals, pure water and warm pure water into the container 1, and also serves a roll of discharging the warm pure water to the outside of the container 1.

Herein, the aspiration unit 24 discharges chemicals, pure water and warm pure water to the outside of the container 1 at a constant liquid discharge rate or at an appropriately modified liquid discharge rate. More specifically, the aspiration unit 24 comprises an aspiration pump with a flow adjusting function which maintains the liquid discharge volume of chemicals, pure water and warm pure water at constant or at an appropriately modified volume, and the aspiration unit 24 is connected to the part 19-1 described below of the control means 19, to appropriately modify the output power of the aspiration pump on the basis of the process signal output from the control part 19-1, for example for the lowering of the output power of the aspiration pump so as to reduce the liquid discharge volume of warm pure water lower than the current liquid discharge volume or for the raising of the output power so as to elevate the liquid discharge volume of warm pure water compared with the current liquid discharge volume.

The solvent feeding means 12 functions to feed the vapor of an organic solvent into the container 1, so as to remove the attached water on the surface of the object W through substitution of the attached water with the organic solvant vapor (to remove the attached water by reducing the surface tension) after the object W passes through the final water rinsing process of the cleaning process, wherein solvent feeding conduit 14 is connected to solvent inlet 12-1 opened at the part of the upper side of the container 1, the part corresponding to the connection part of the liquid discharge conduit 11, and the solvent feeding conduit 14 is provided with solvent valve 13 and is also connected to vapor generation unit 25, wherein the organic solvent as vaporized in the vapor generation unit 25 is fed into the container 1 by the opening of the solvent valve 13 and the feeding is stopped by the closing of the valve 13.

Herein, the vapor generation unit 25 reserves an organic solvent having an extremely low surface tension and being readily miscible with the attached water on the surface of the object W, for example IPA (isopropyl alcohol) and comprises a vapor generation tank provided with a heating means such as electric heater to heat and boil the organic solvent for vaporization, wherein the vapor of the organic solvent is fed into the container 1, through the solvent feeding conduit 14 which connects the vapor generation tank and the like and the container 1. Not shown in the figure, any optional forced feed pump capable of feeding an organic solvent at a necessary pressure and a reservoir tank of organic solvent can be satisfactorily connected to the solvent feeding conduit 14, instead of the vapor generation unit 25, in order to feed the organic solvent fog into the container 1. In this case, the organic solvent fog is generated through a fog spray nozzle arranged on the wall face of the container 1. Additionally, the organic solvent is satisfactorily fed into the container 1, while heating the organic solvent within a range of 30 to 60° C. by a heating means such as electric heater arranged on the reservoir tank, whereby an effect of preventing temperature reduction in the container 1 can be brought about, compared with feeding of an organic solvent fog at ambient temperature.

Gas feeding means 15 serves a role to continuously feed inert gas ($N_2$) into the container 1 where the object W is transferred and placed, after the upper opening of the container 1 is sealed with the sealing lid 21, to remove air infiltrated into the container 1 during the transfer and placing of the object W to the outside of the container 1, whereby the inside of the container 1 is consistently maintained at a inert gas atmosphere at each process stage from the cleaning process to the drying process thereof, and also serves a role to continuously feed the inert gas into the container 1 on the basis of the process signal from the control means 19 (such as to reduce or enlarge the valve opening) based on the detection signal (pressure information of the inside of the container 1) from the detection means 18, during the discharge of warm pure water to the outside of the container 1 under aspiration by the liquid discharge means 7 in the drying process of the object W. Wherein, gas feeding conduit 17 is connected to gas inlet 15-1 opened on the wall face at the part of the upper side of the container 1, the part corresponding to the connection part of the solvent feeding conduit 14, and the gas feeding conduit 17 is provided with gas valve 16, and through the opening and closing of the valve 16, inert gas is continuously fed from the gas inlet 15-1 at a series of process stages from the cleaning process to the termination of the drying process, or inert gas is intermittently fed at each process stage from the cleaning process to the drying process, or the feeding thereof is terminated.

Herein, the gas valve 16 feeds inert gas through valve opening and closing operation, at a constant feeding rate or at a feeding rate appropriately modified. More specifically, the gas valve comprises a valve with a flow adjusting function to feed inert gas at a constant feeding volume or at an appropriately modified feeding volume, which is connected to the control part 19-1 of the control means 19, to appropriately adjust and modify the valve opening degree on the basis of the process information output from the control part 19-1, for example for the reduction of the valve opening degree so as to reduce the inert gas feeding volume lower than the current volume or for the elevation of the valve opening degree so as to increase the feeding volume. In the figure, 26 represents a safety (supplementary) valve provided with the gas feeding conduit 17.

Gas detecting means 18 serves a role to serially detect the pressure reduction P1 in the container and serially output the detection signal (pressure information) to the control means, particularly during liquid discharge of warm pure water under aspiration, the discharge being initiated after warm pure water is fed and reserved in the container 1 and the upper space 20 procured upward the water surface L is filled with the vapor of the organic solvent, and the detecting means 18 comprises a piezo electric sensor or a pressure sensor, with a function to transform the pressure change in the container 1 into a voltage value and serially output the pressure value, namely detection signal, to the process part 19-10 described below of the control part 19-1. The sensor is located on the wall face of the container 1 where the upper space 20 is procured and is also connected with the process part 19-10 of the control part 19-1, whereby the sensor outputs the detection signal, namely the current pressure reduction P1, to the process part 19-10.

In the present embodiment, herein, the detecting means 18 is connected with the intermediate part of the gas feeding conduit 17 (see FIG. 1), and the pressure reduction P1 in the container 1 can be detected through the gas feeding conduit 17.

Figure 4:
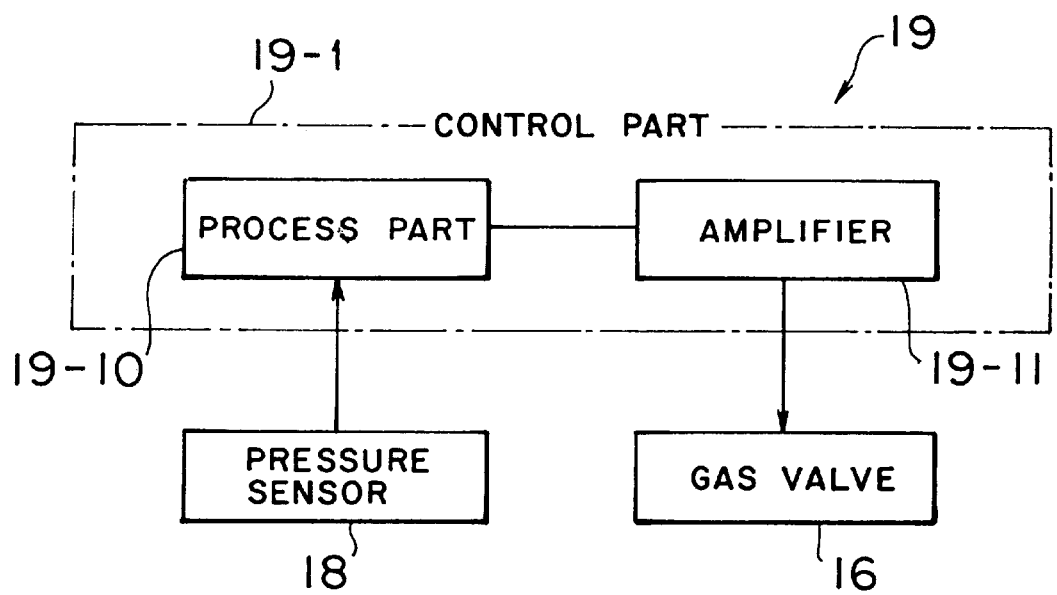
FIG. 4 is a control block view depicting one example of a control means maintaining the pressure reduction P1 in the container at preset pressure reduction value P.
Figure 5:
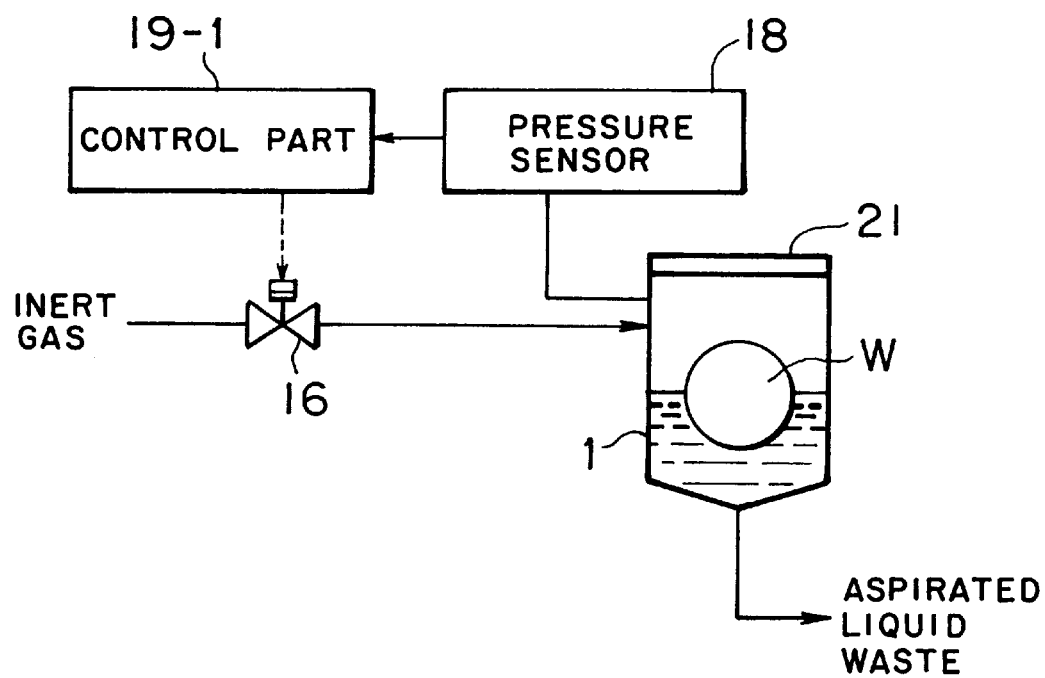
FIG. 5 is a schematic control view of the same.
Figure 6:
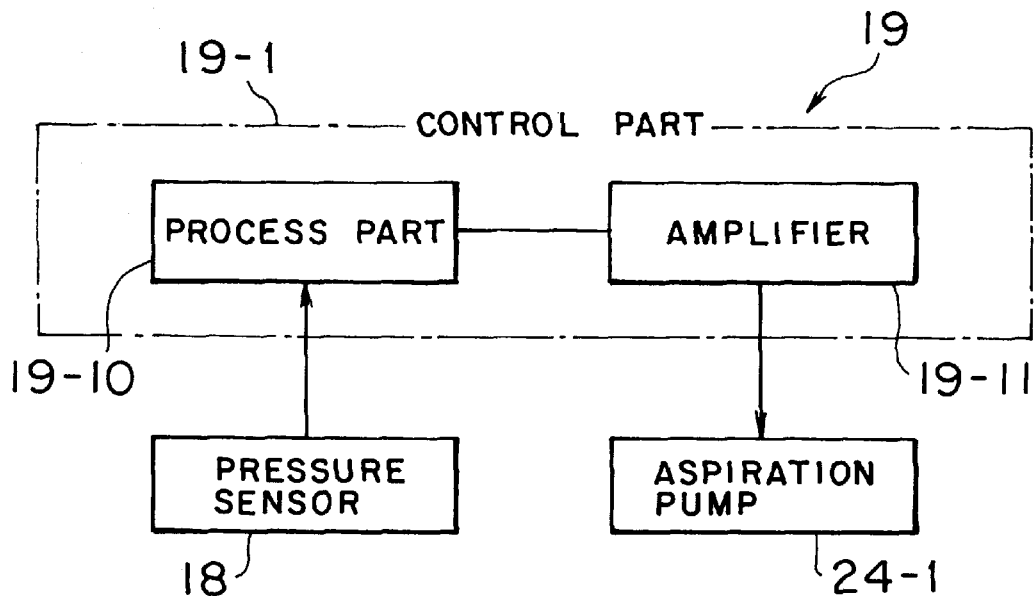
FIG. 6 is a control block view depicting another example of the control means maintaining the pressure reduction P1 in the container at the preset pressure reduction value P.
Figure 7:
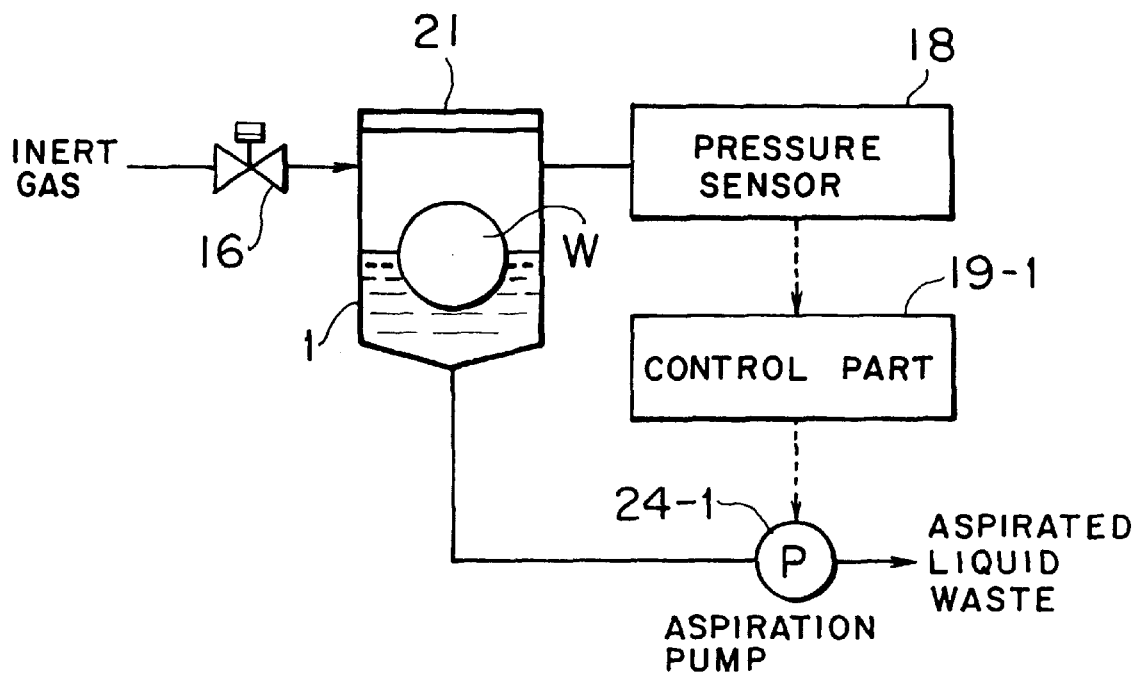
FIG. 7 is a schematic view of the same.

The control means 19 serves a role to adjust and modify the feeding rate (feeding volume) of inert gas into the container 1 by appropriately adjusting and modifying the current valve opening degree of the gas valve 16 of the gas feeding means 15, for example for the reduction or enlargement of the current valve opening degree, so as to maintain the pressure reduction P1 in the container 1 at the preset pressure reduction value P, until the liquid discharge of warm pure water in the container 1 is terminated, and the control means 19 also serves a role to adjust and modify the aspiration power of the aspiration unit 24 (aspiration pump) to thereby adjust and modify the liquid discharge rate (liquid discharge volume) of warm pure water; the control means 19 is provided with the regulation part 19-1 with the memory of the preset pressure reduction P in the container 1 to carry out the determination process of the current pressure reduction P1 in the container 1 which is serially output from the detection means 18 on comparison with the preset pressure reduction P, wherein, for example, the result of the determination process such that the current pressure reduction P1 in the container 1 is lower than the preset pressure reduction value P, induces an output of a process information for the gas valve 16 to reduce the valve opening so as to reduce the feeding rate of inert gas than the current feeding rate (see FIG. 4), or an output of a process information for the aspiration unit 24 to elevate the aspiration power so as to elevate the liquid discharge rate (see FIG. 6), whereby the pressure reduction P1 in the container 1 is controlled and regulated at the preset pressure reduction value P, until the liquid discharge of warm pure water in the container 1 under aspiration is terminated.

For establishing the present invention, it is additionally important that the water temperature of warm pure water fed into the container 1 is preset within a range of 30 to 65° C.; the preset pressure reduction value P in the container 1 is preset within a range of −350 mmHg to −50 mmHg, until the termination of the liquid discharge process of warm pure water in the container 1 as initiated after the feeding of the vapor of the organic solvent into the upper space 20 in the container 1 after the termination of the final water rinsing process of a series of cleaning processes of the object.

Herein, the water temperature of warm pure water is significant for promoting the drying of the object W, at the mixing substitution of the attached water with the vapor of the organic solvent and at the last stage of the drying process carried out under reduced pressure. More specifically, without the heating of the object W to an appropriate temperature prior to the mixing substitution of the attached water on the surface of the object W with the vapor of the organic solvent, the mixing substitution of the attached water with the vapor of the organic solvent does not effectively progress, or a mixture of the organic solvent with a trace amount of the attached water remaining on the surface of the object W is not rapidly removed during the last stage of the drying process carried out under reduced pressure, so that some outcome develops, such as the prolongation of the drying time, in proportion. In accordance with the present invention, thus, the lower water temperature of warm pure water is preset to 30° C., taking account of the heating process of the object W so as to promote the drying of the object W. Alternatively, if warm pure water is at a far higher temperature so as to intentionally promote the drying of the object W, the mixing substitution action of the attached water on the surface of the object W with the vapor of the organic solvent does not occur. That is, the vapor of the organic solvent condenses on the surface of the object W, due to the difference in temperature between the boiling point of the organic solvent and the surface temperature of the object W, so that mixing substitution of the attached water with the organic solvent occurs. If the surface temperature of the object W is elevated around the boiling point of the organic solvent, alternatively, the condensation on the surface hardly occurs, which reduces the vapor drying effect essential to the use of the vapor of the organic solvent, which proportionally prolongs the drying time, consequently. In accordance with the present invention, thus, the higher water temperature of warm pure water is preset to 65° C., lower than the boiling point of the organic solvent at atmospheric pressure.

Therefore, taking account of the disadvantages caused by too low water temperature or too high water temperature of warm pure water as described above, in accordance with the present invention, under the provision that the water temperature during feeding of warm pure water is preset to 30° C., the preset pressure reduction value P in the container 1 is −350 mmHg so as to establish in the container 1 the conditions such that the following re-vaporization phenomenon is continuously repeated; the re-vaporization phenomenon means re-vaporization of the organic solvent around the exposed object W from a mixture solution layer N formed on the water surface L of warm pure water, which surface is lowered following the liquid discharge under aspiration, for example mixture solution layer N formed on the water surface L of warm pure water, by the condensation of the vapor of an organic solvent such as IPA (isopropyl alcohol) with an extremely small surface tension. If the preset pressure reduction value P is below −350 mmHg under the provision that the water temperature of warm pure water is preset to 30° C., more specifically, the water temperature of warm pure water becomes around the boiling point, there will be the possibility of disadvantageous behavior such as foaming and the like in the warm pure water. In other words, the generated foam floats up to the water surface L, so that the mixture solution layer N formed on the water surface L is damaged. Then, the liquid current developing in the mixture solution layer N to remove the attached water from the surface of the object W, is deteriorated, so that no effect of the liquid current developing in the mixture solution layer N over drying is possibly brought about. Alternatively, the preset pressure reduction value P in the container 1 should be −50 mmHg, under the provision that the water temperature of warm pure water during feeding is preset to 65° C. More specifically, when the preset pressure reduction value P is above −50 mmHg under the provision that the water temperature of warm pure water is preset to 65° C., the organic solvent may not any more be re-vaporized effectively from the mixture solution layer N during the process of discharging warm pure water under aspiration from the bottom side of the container 1.

Regarding the conditions to continuously repeat the re-vaporization phenomenon of the organic solvent in the container 1, it might be realized if the water temperature of warm pure water is preset at a temperature below 30° C., for example at 25° C. and the preset pressure reduction value P in the container 1 is below −350 mmHg, for example −400 mmHg, irrespective of the heating of the object W so as to promote the drying of the object W, but if the preset pressure reduction value P is lowered to −400 mmHg, the pressure resistance of the container should necessarily be further improved against such pressure reduction, which induces escalation in the manufacturing cost of such container 1 to meet the required pressure resistance; if the pressure in the container 1 is eventually reduced down to −400 mmHg, a proportionally large aspiration pump is required. Therefore, such disadvantages occur, consequently. Additionally, if the water temperature of warm pure water is preset above 65° C., the object W is affected disadvantageously by such overheating, to cause the deterioration of the quality of the object W, in addition to the aforementioned disadvantage such as the reduction of the vapor drying effect.

In accordance with the present invention, hence, taking account of the disadvantages caused by too low water temperature and too high water temperature of warm pure water and the disadvantage caused by the lowering of the preset pressure reduction value P in the container 1 and also taking account of the requirement for continuously repeating the re-vaporization phenomenon of the organic solvent around the exposed object W from the mixture solution layer N formed on the water surface L during the liquid discharge process of warm pure water from the bottom side of the container 1, the presetting of the pressure reduction P in the container 1 within a range of −350 mmHg to −50 mmHg is an essential condition, under the provision that the water temperature of warm pure water is preset within a range of 30 to 65° C. Preferably, the preset pressure reduction value P is within a range of −300 to −150 mmHg under the provision that the water temperature of warm pure water is preset within a range of 40 to 50° C.; the experimental results suggest that the preset pressure reduction value P in the container 1 is preferably at −240 mmHg, under the provision that the water temperature of warm pure water is preset to 45° C.

Figure 8:
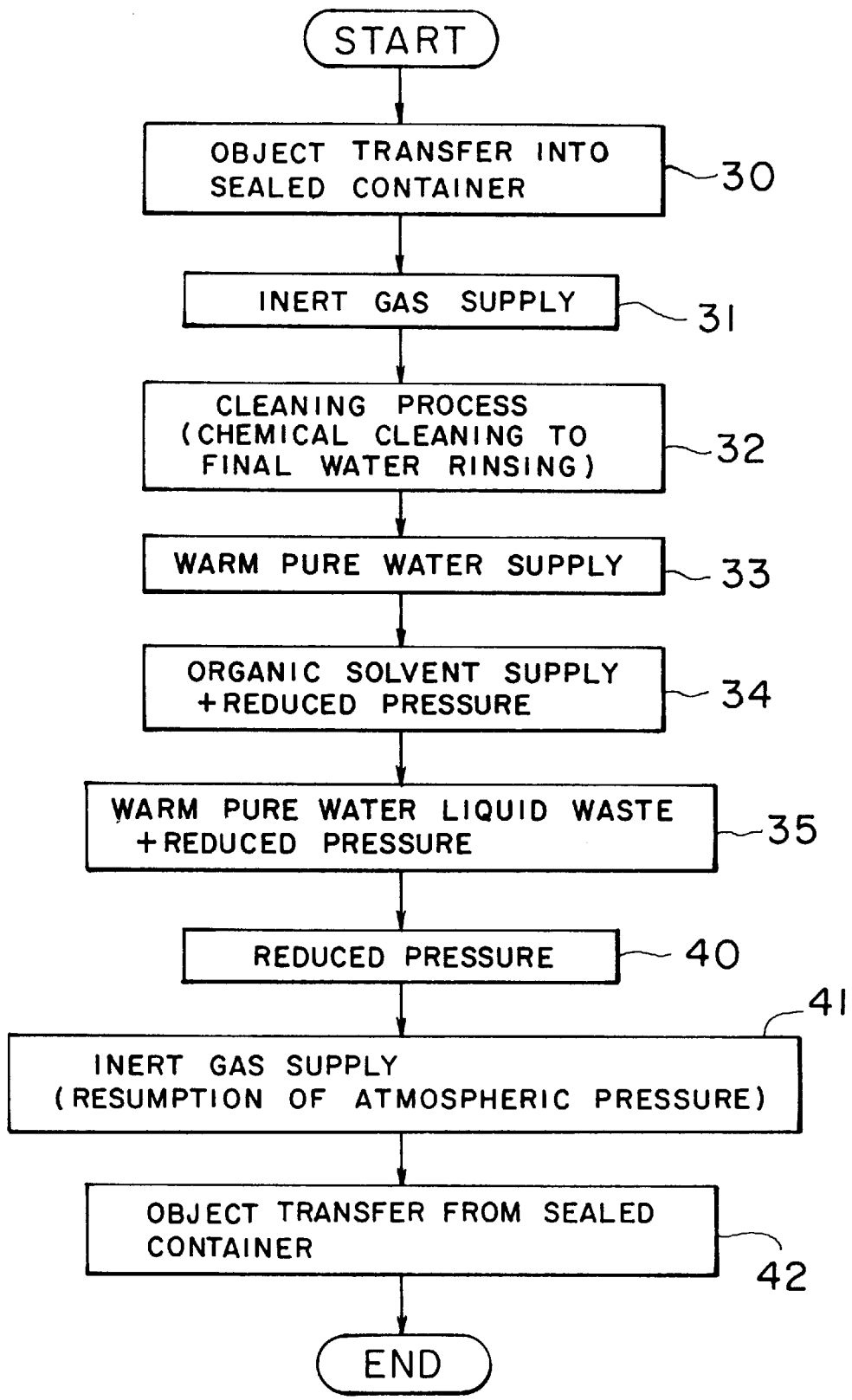
FIG. 8 is a flow chart depicting the process operations at a series of processes from the cleaning process to the drying process.
Figure 9:
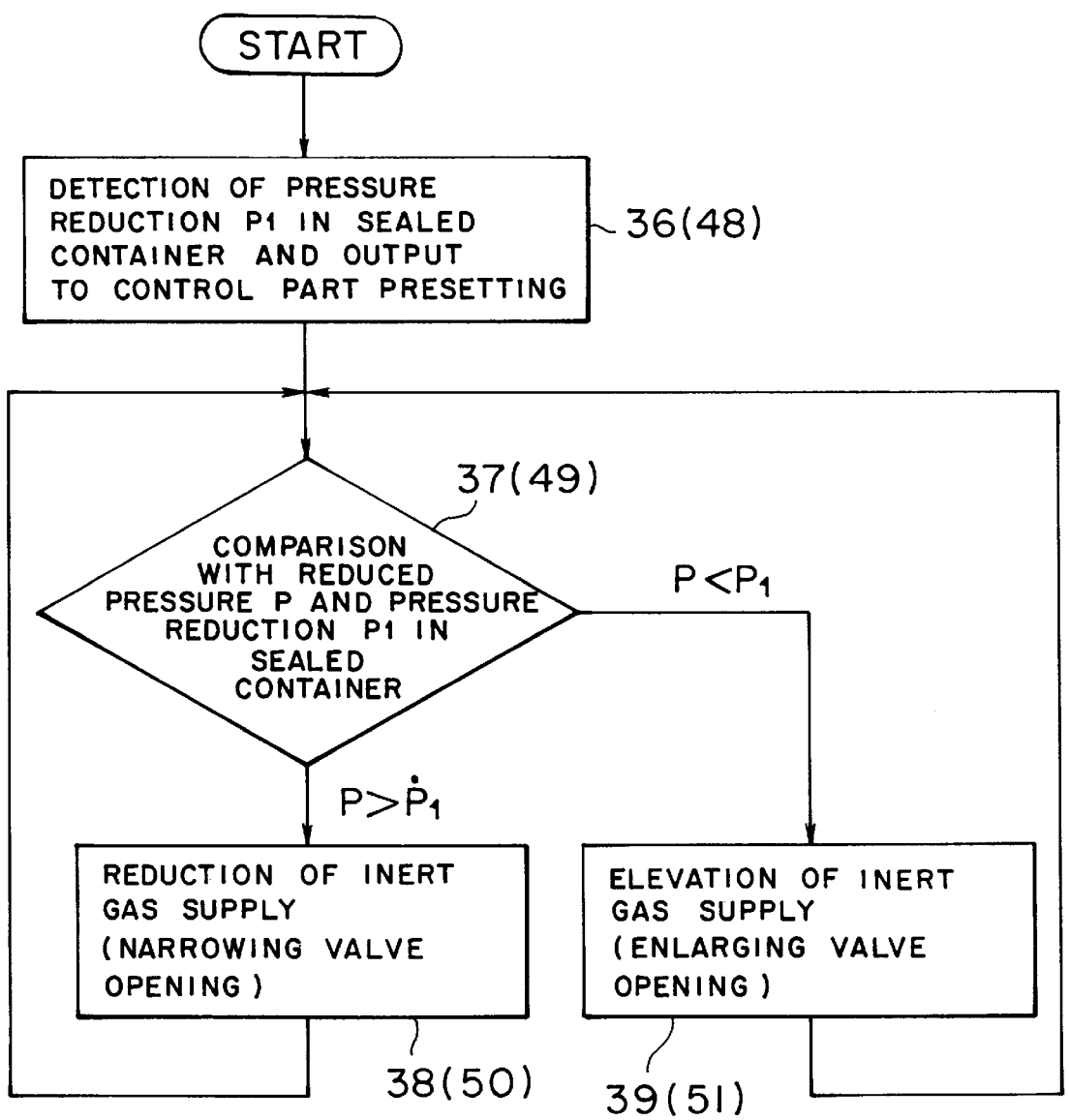
FIG. 9 is a flow chart depicting the operation to control the pressure reduction P1 in the container at the preset pressure reduction value P during the discharge of warm pure water under aspiration.
Figure 10:
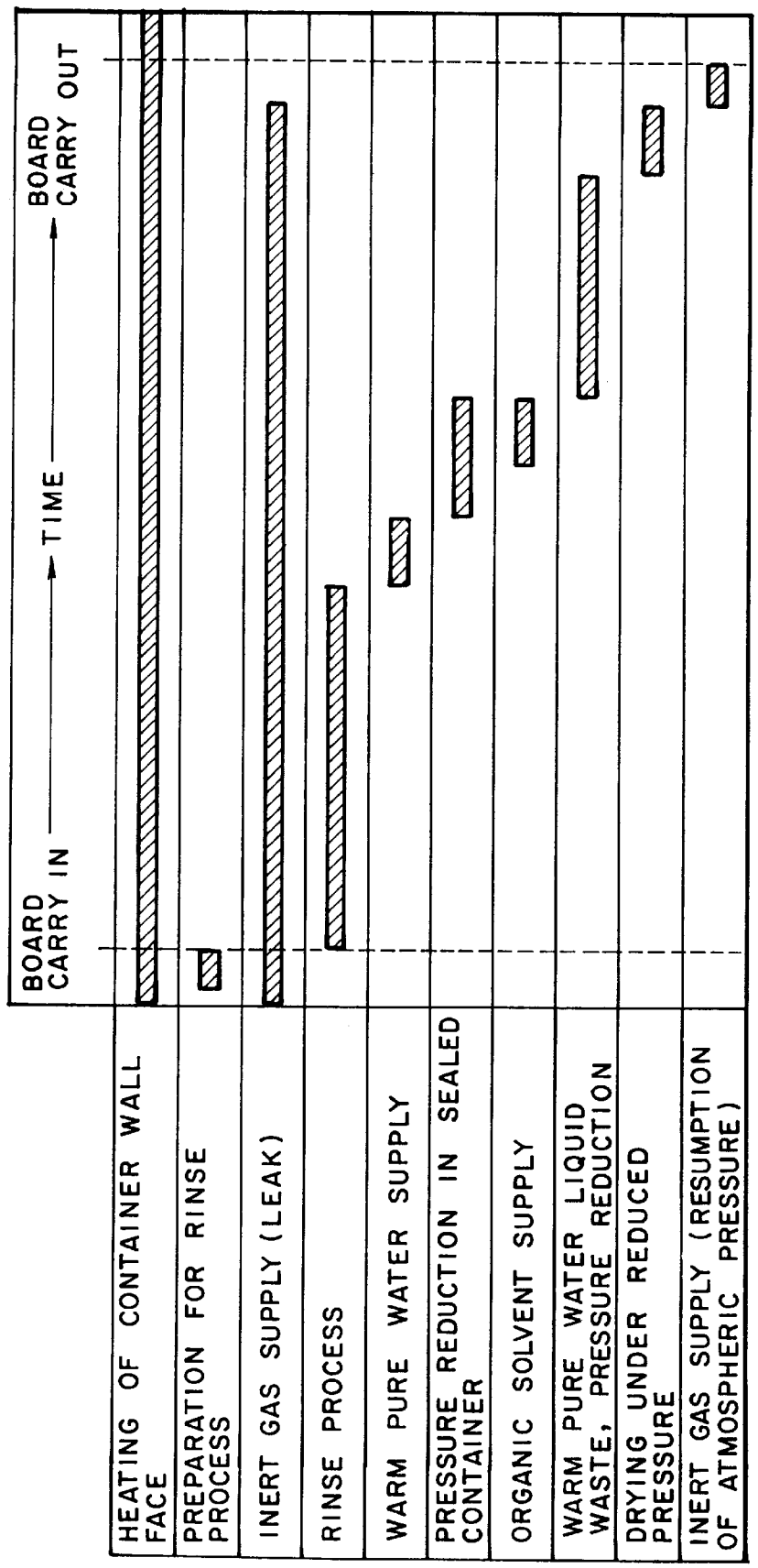
FIG. 10 is the time chart of the same.

Description will now follow about the treatment method by using the treatment system of such structure (referred to as "present method" hereinafter), with reference to the flow chart and time chart of the process operations for a series of processes from cleaning process to drying process as shown in FIGS. 8 and 10, and the flow chart to regulate and control the pressure reduction P1 in the container 1 at the drying process shown in FIG. 9. Firstly, from the opened upper opening into the container 1, a plurality of sheets of the object W are transferred and placed at an appropriate interval, vertically in parallel arrangement (Step 30). When the object W is transferred and placed in the container 1 followed by sealing of the upper opening of the container 1 by the sealing lid 21, the gas valve 16 of the gas feeding means 15 is opened to initiate the feeding of inert gas through the gas feeding conduit 17 into the container 1 from the gas inlet 15-1 (Step 31). Simultaneously, any one of the liquid discharge valves 8, 9 or both of the two are opened to carry out the gas discharge from the container 1.

If an inert gas atmosphere is prepared in the container 1, the chemical valve 3 opens to continuously and serially feed several types of chemicals at a given time interval, from the liquid feeding inlet 2-1 on the bottom, through the liquid feeding conduit 6, into the container 1, depending on each process stage of the chemical cleaning process, and in the container 1, the ascending liquid current of the chemicals, flowing in contact to each surface of the object W, is formed, whereby the chemical cleaning process (chemical process) of the object W is performed. After the completion of the chemical cleaning, chemical valve 3 is closed, then, pure water valve 4 is opened to feed pure water continuously into the container 1 from the liquid inlet 2-1 on the bottom through the liquid feeding conduit 6, thereby the ascending liquid current of the pure water, flowing in contact to each surface of the object, is formed and the final rinsing process is performed (Step 32). During these cleaning processes, the liquid discharge valve 9 is opened, and excess chemicals and pure water are discharged as over-flow liquid, under aspiration, from the liquid discharge outlet 7-1 through the liquid discharge conduit 11 to the outside of the container 1.

After the termination of a series of cleaning processes from chemical cleaning to the final water rinsing process the pure water valve 4 is closed to stop the feeding of pure water into the container 1, and then warm pure water valve 5 is opened to continuously feed warm pure water at a temperature of 45° C. from the liquid feeding inlet 2-1 through the liquid feeding conduit 6 into the container 1, where the ascending water current of warm pure water flowing in contact to the surface of the object W is formed to perform the heating process in which the object W is heated to a temperature around 45° C. (Step 33). The liquid discharge valve 9 is kept opened after the completion of the rinsing process, in order to discharge pure water in the container 1 under aspiration from the liquid discharge outlet 12-1 through the liquid discharge conduit 11 to the outside of the container 1 because of the feeding of warm pure water, so that the inside of the container 1 is substituted with warm pure water, while excess warm pure water is then discharged as over-flow water under aspiration to the outside of the container 1.

When the warm pure water valve 5 is closed to stop the feeding of warm pure water into the container 1 on completion of the heating process of the object W via the thermal energy of warm pure water at 45° C., then, the solvent valve 13 of the solvent feeding means 12 is opened to feed the organic solvent vapor which has been vaporized in the vapor generation unit 25, from the vapor inlet 12-1 through the solvent feeding conduit 14 into the upper space 20 procured upward the water surface L of warm pure water in the container 1 (Step 34). The organic solvent is fed until the upper space 20 is filled with its vapor, and after the preparation of vapor atmosphere in the upper space 20, the solvent valve 13 is closed to terminate the feeding. The liquid discharge valve 9 is kept opened during this process, to carry out gas discharge from the upper space 20 concurrently with the feeding of the organic solvent vapor into the upper space 20, so that the pressure in the upper space 20 is appropriately reduced.

Then, the liquid discharge valve 8 is opened to initiate the liquid discharge of warm pure water in the container 1 under aspiration at a required discharge rate from the liquid feeding inlet 2-1 on the bottom through the liquid discharge conduit 10 to the outside of the container 1 (Step 35). Concurrently, the detecting means 18 detects the current pressure reduction P1 in the container 1, following the liquid discharge of warm pure water under aspiration, and the resulting pressure information is sequentially output to the regulation part 19-1 of the control means 19 (Step 36). When the pressure information is output to the regulation part 19-1, the process part 19-10 of the regulation part 19-1 performs comparative process between the current pressure reduction P1 in the container 1 and the preset pressure reduction value P at −240 mmHg for the inside of the container 1 (Step 37). If determination process is done such that the current pressure reduction P1 is lower than the preset pressure reduction value P (P>P1), a process signal for the reduction of the valve opening degree of the gas valve 16 so as to reduce the feeding rate of inert gas, of which feeding is continued from the cleaning process of the object W, is output through amplifier 19-11 to the gas valve 16 (Step 38). Alternatively, if determination process is done such that the current pressure reduction P1 is higher than the preset pressure reduction value P (P<P1), a process signal for the elevation of the valve opening degree of the gas valve 16 so as to elevate the feeding rate of inert gas is output through amplifier 19-11 to the gas valve 16 (Step 39). The regulation and control of the pressure reduction P1 should be continued, until the liquid discharge of warm pure water under aspiration is completed.

After the completion of discharging warm pure water in the container 1, the condition of reduced pressure under aspiration is kept for a predetermined period in order to exhaust all the remaining organic solvent, mixture solution with the organic solvent, moisture and the like to the outside of the container 1 (Step 40). Finally, by elevating the volume of inert gas still continuously fed into the container 1 to resume atmospheric pressure (ambient pressure) in the container 1 (Step 41), and opening the sealing lid 21 to transfer the object W out of the container 1 (Step 42), a series of processes from the cleaning process to the drying process can be completed. Finally, the gas valve 16 and the liquid discharge valve 8 should be closed.

By the present method in this embodiment, accordingly, the pressure reduction P1 in the container 1 is maintained at the preset pressure reduction value P, during the discharging warm pure water which is initiated after the feeding of the organic solvent vapor into the upper space 20 procured upward the water surface L of the warm pure water. More specifically, conditions for repeatedly continuing the re-vaporization phenomenon to re-vaporize the organic solvent from the mixture solution layer N on the water surface L around the exposed object W from the mixture solution layer N can be established in the container 1.

Figure 3:
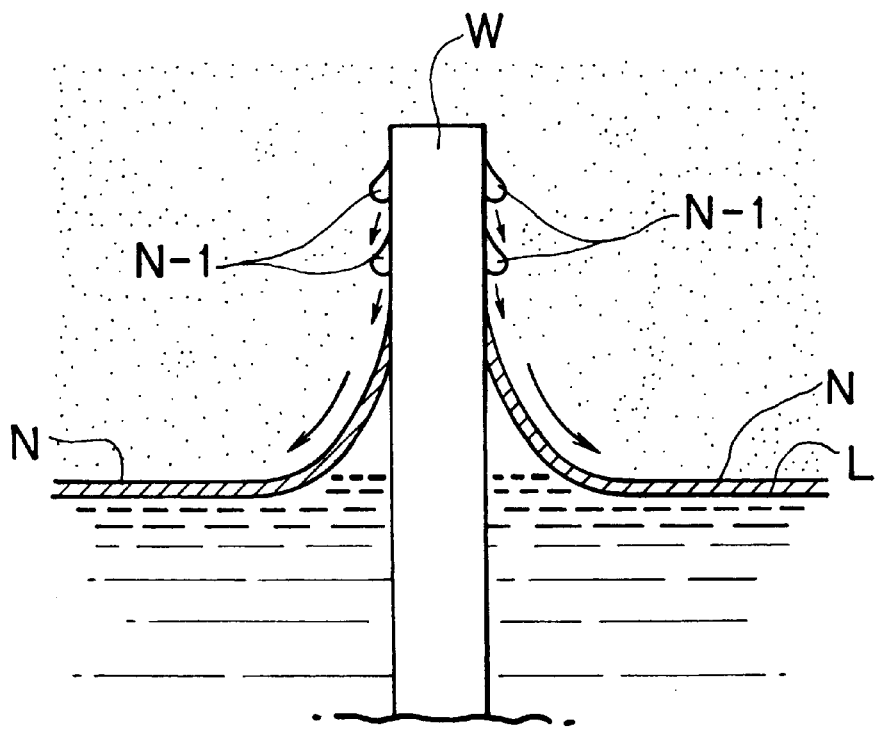
FIG. 3 is an enlarged schematic view of the major part of the drying principle of a object, owing to two actions of a substitution action of the attached water with an organic solvent in the container and liquid current action occurring in the mixture solution layer from the surface of the object toward the water surface of warm pure water, under the provisions of continuous re-vaporization of the organic solvent dissolved in warm pure water around the exposed object during a process of discharging warm pure water under aspiration.

At the liquid discharge process of warm pure water under aspiration, therefore, the volume of the organic solvent to be used per each process cycle can be reduced largely compared with conventional processes by the utilization of the re-vaporization from the mixture solution layer N, which is formed on the water surface L and in contact with the surface of the object W. Additionally, the vapor of the organic solvent fed into the upper space 20 is maintained as vapor, owing to the atmosphere under reduced pressure kept at the preset value P of −240 mmHg and to the thermal energy of warm pure water at 45° C., so that the vapor can be kept in contact to the surface of the exposed object W, and condensed on the object surface due to the temperature difference from the object surface and be therefore subjected to mixing substitution with the attached water, so that the attached water flows over the surface of the object W together with the mixture solution N-1 containing the organic solvent, to be dropped toward the water surface L of warm pure water, whereby the concentration gradient of the organic solvent in the mixture solution layer N formed on the water surface L of warm pure water is maintained constant because the mixture solution N-1 is continuously dropped and supplemented, until the liquid discharge of warm pure water is terminated. Thus, the attached water is securely and rapidly removed from the surface of the object W through the stable and effective liquid current action developing in the mixture solution layer N toward the water surface of warm pure water (FIG. 3).

In accordance with the present method, more specifically, the object W is securely and rapidly processed for drying, through two actions of substitution action of the attached water with the organic solvent and liquid current action developing in the mixture solution layer N from the surface of the object W toward the water surface L of warm pure water. Then, the organic solvent is re-vaporized around the object W, from the mixture solution layer N in contact to the surface of the object W following the lowering of the water surface L due to the liquid discharge of warm pure water under aspiration, and the condensation on the surface is repeated continuously for mixing substitution with the attached water, while the attached water flows, together with the mixture solution N-1 containing the organic solvent, over the surface of the object W and is dropped toward the water surface L of warm pure water. In other words, by dropping and supplementing continuously the mixture solution N-1 containing the organic solvent into the mixture solution layer N on the water surface L lowered following the liquid discharge of warm pure water under aspiration, the action of liquid current, from the surface of the object W to the water surface of warm pure water, due to the concentration gradient of the organic solvent developing in the mixture solution layer N, can be securely exerted, while the attached water can effectively removed from the surface of the object W, owing to the two actions of the substitution action and the liquid current action in the mixture solution layer N.

Figure 11:
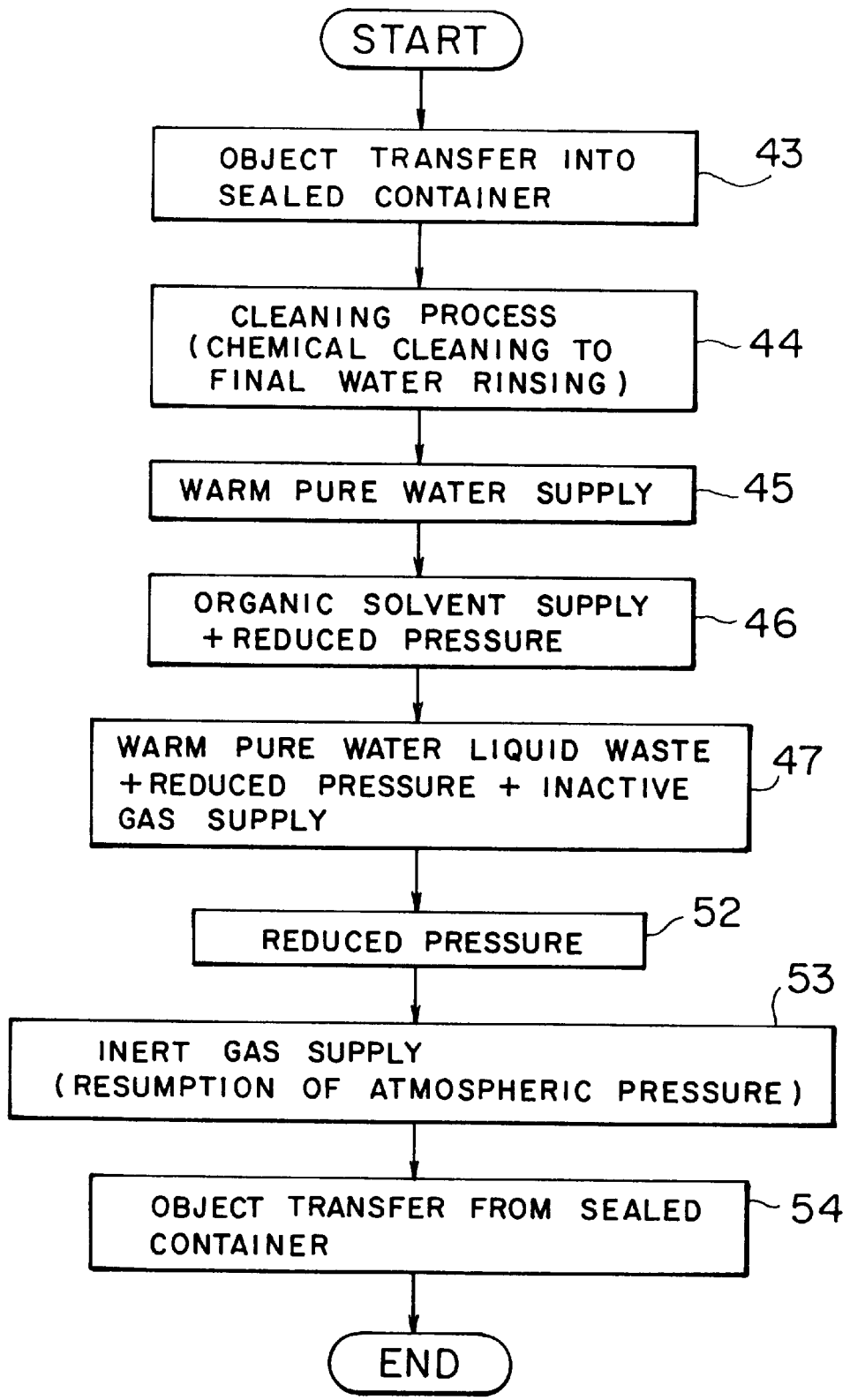
FIG. 11 is a flow chart depicting another example of the process operations at a series of processes from the cleaning process to the drying process.
Figure 12:
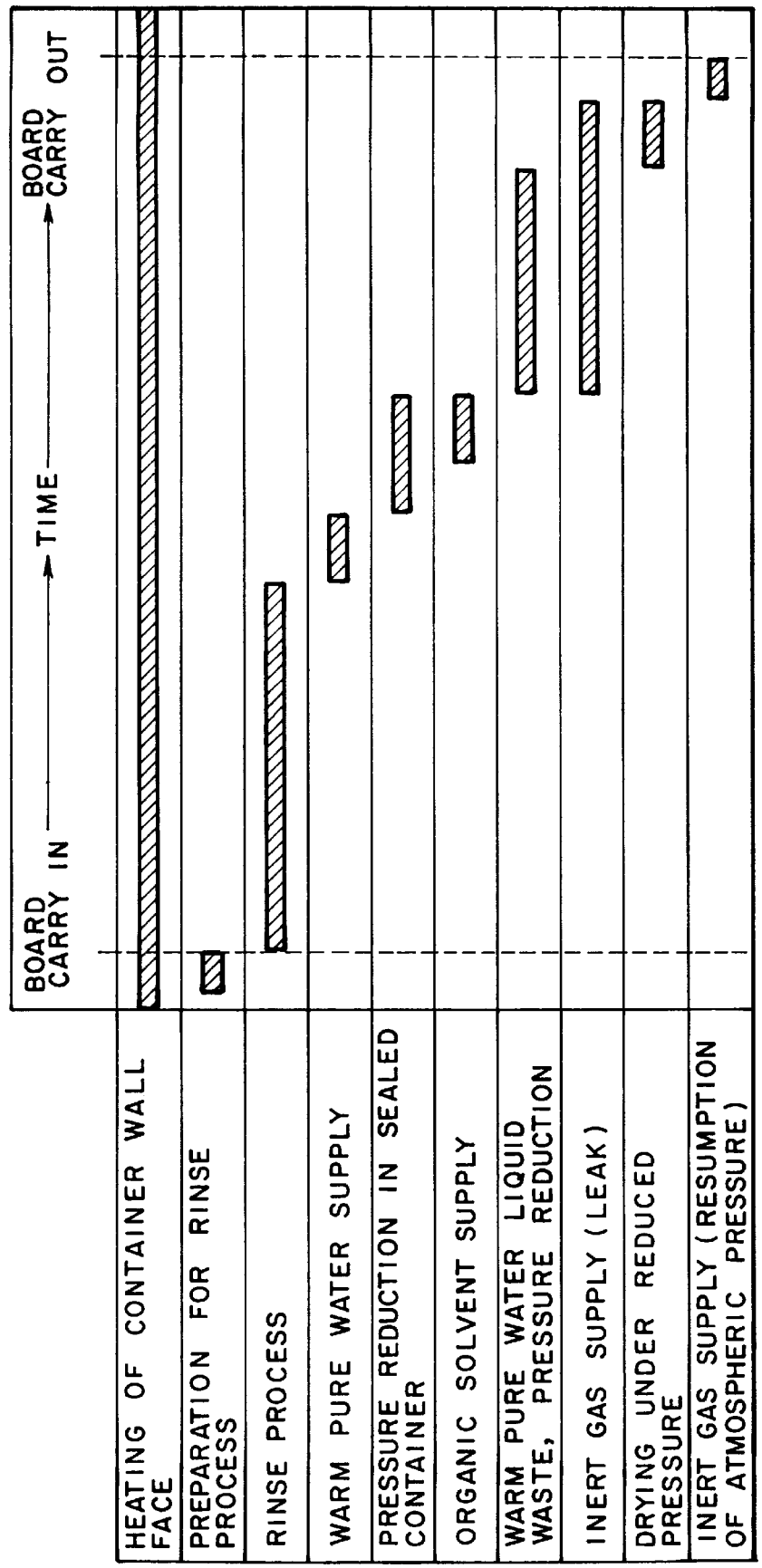
FIG. 12 is the time chart of the same.

FIGS. 11 and 12 are the flow chart and time chart of another embodiment of the treatment method of a series of processes from cleaning process to drying process in accordance with the present invention, and in the embodiment, the timing of feeding inert gas into the container 1 is modified but except for the modification of the timing, the embodiment is essentially the same as in the detailed description of the embodiment described above.

For brief description, a plurality of sheets of object W are transferred and placed from the opened upper opening of the container 1 into the container 1 (Step 43), and then, chemical valve 3 is opened at a state that the upper opening is sealed with sealing lid 21 or not sealed with the lid 21, to continuously feed chemicals into the container 1 for chemical cleaning of the object W (chemical process). Then, pure water valve 4 is opened to continuously feed pure water in the container 1 to perform a series of rinsing processes up to the final water rinsing process (rinsing process) of the object W (Step 44). Subsequently, warm pure water valve 5 is opened to continuously feed warm pure water at a water temperature of 45° C. into the container 1, for a heating process of the object W, comprising heating the surface of the object W at a temperature around 45° C. (Step 45). By opening solvent valve 13, then, the vapor of the organic solvent is fed into the upper space 20 in the container 1, which has been procured upward the water surface L of warm pure water (Step 46). By subsequently opening the liquid discharge valve 8 to initiate the liquid discharge of warm pure water, warm pure water in the container 1 is discharged from the liquid feeding inlet 2-1 to the outside of the container 1 at a necessary liquid discharge rate; simultaneously, the gas valve 16 is opened to initiate the feeding of inert gas into the container 1 (Step 47). Thereafter, a series of processes from rinsing process to drying process are performed, including the stages from Step 48 to Step 51, like Step 36 to Step 39 as described in detail in the flow chart of FIG. 9 in the aforementioned embodiment, and the stages from Step 52 to Step 54, like Step 40 to Step 42 as described in detail in the flow chart of FIG. 8.

Figure 13:
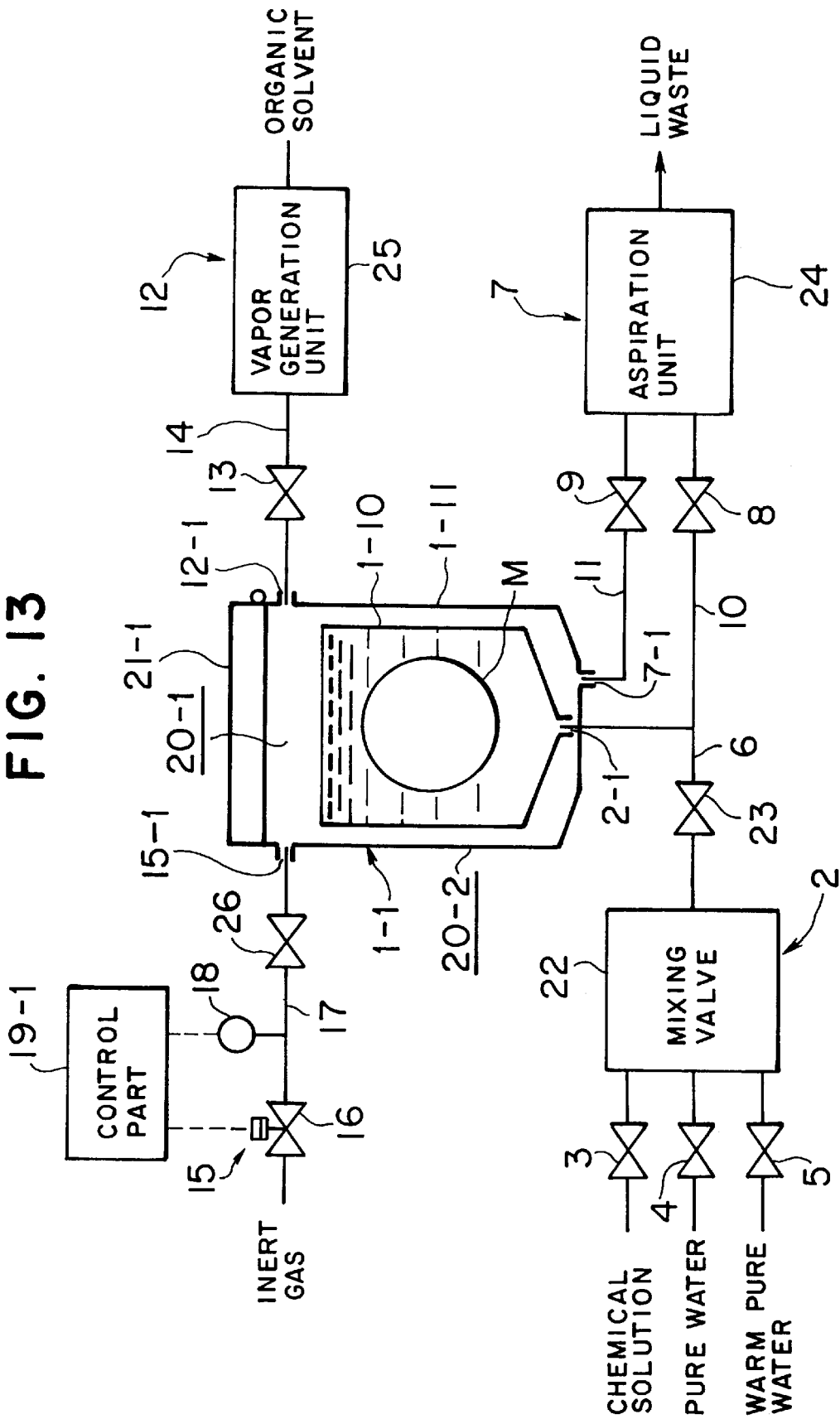
FIG. 13 is a schematic view depicting one example of the treatment system with a container of a double structure of inner and outer structures to carry out the treatment method of semiconductor wafers and the like in accordance with the present invention.

FIG. 13 depicts still another embodiment wherein the structure and shape of container 1-1 has been modified and comprises a double structure of inner and outer structures, and the embodiment is essentially the same as the aforementioned embodiments described in detail, except for the double structure of inner and outer structures. Therefore, the same symbol is used for the same structural component, and the detailed description is omitted.

More specifically, the container 1-1 in the embodiment is approximately of a size (in a shape with an opening) such that a plurality of sheets of object W are supported and placed at their vertical state in parallel at a given interval, of a double structure of inner and outer structures, comprising process tank 1-10 of a box shape with a bottom and with an opening on the upper part and of a depth enough to immerse and sink the object W, and a sealing tank 1-11 approximately of a size such that the process tank 1-10 might be sealed and placed freely with a necessary space from the opened upper side and outer periphery of the tank wall and of a box shape with a bottom and with an upper opening, where opening and closing lid 21-1 is arranged in freely opening and closing motion; liquid feeding conduit 6 of the liquid feeding means 2 described in detail in the aforementioned embodiment is connected to the bottom side of the process tank 1-10, while the liquid discharge conduits 10, 11 of the liquid discharge means 7 are individually connected to the intermediate part of the liquid feeding conduit 6 and the bottom side of the sealing tank 1-11, and concurrently, to the upper side of the sealing tank 1-11 are connected the solvent feeding conduit 14 of the solvent feeding means 12 and the gas feeding conduit 17 of the gas feeding means 15.

In the container 1-1 of such inner and outer double structures, excess chemicals and pure water involved in the continuous feeding of chemicals and pure water into the process tank 1-10 during the cleaning process of the object W and excess warm pure water involved in the continuous feeding of warm pure water into the process tank 1-10 during the heating process of the object W become over-flow water, which then flows toward the side of the sealed tank 1-11 from the upper opening of the process tank 1-10 and is then readily discharged under aspiration from the liquid discharge outlet 7-1 on the bottom to which is connected liquid discharge conduit 11 of the sealed tank 1-11. Then, the vapor of the organic solvent is fed into the upper space 20-1 procured upward the process tank 1-10 and into the peripheral space 20-2 between the process tank 1-10 and the sealed tank 1-11, to prepare an atmosphere of the organic solvent vapor in the upper space 20-1 and the peripheral space 20-2, while during the liquid discharge of warm pure water under aspiration, which is initiated after closing of the solvent valve 13, warm pure water is discharged under aspiration at a necessary liquid discharge rate from the liquid feeding inlet 2-1 on the bottom of the process tank 1-10 through the liquid discharge conduit 10 connected to the liquid feeding conduit 6.

Additionally, the operations of a series of processes from cleaning process to drying process by using the container 1-1 of such inner and outer double structures are carried out in the same manner as in the detailed description of the aforementioned embodiments, on the basis of the flow chart of FIG. 8 and the time chart of FIG. 10 in the detailed description of the embodiment and the flow chart for regulating and controlling the pressure reduction P1 of the sealed tank 1-11 during the drying process as shown in FIG. 9, or on the basis of the flow chart of FIG. 11, the time chart of FIG. 12 and the flow chart FIG. 9.

In the embodiments aforementioned, IPA (isopropyl alcohol) is used as the organic solvent, but in addition to isopropyl alcohol, use is made of methyl alcohol, ethyl alcohol and the like as alcohols. Other than alcohols, then, use is made of water-soluble organic solvents with a property to reduce the surface tension of the attached water on the object surface, including ketones such as acetone and diethyl ketone; ethers such as ethyl ether and monomethyl ether; and polyhydric alcohols such as ethylene glycol.

The present invention thus configured has the following actions.

1. At the process comprising a process of feeding warm pure water at a temperature range of 30 to 65° C. into a container to a water level enough to immerse and sink an object after completion of a series of cleaning processes from chemical cleaning to water rinsing process, a heating process of the object to a necessary temperature around 30 to 65° C. via the thermal energy of the warm pure water, and a liquid discharge process under aspiration of discharging the warm pure water from the bottom side of the container, the process being initiated after the termination of the feeding of an organic solvent in the form of the vapor or fog into the upper space procured upward the water surface of the warm pure water, the pressure reduction in the container during the liquid discharge process should be maintained at a preset pressure reduction value P within a range of −350 mmHg to −50 mmHg so that the following conditions should be established in the container; the vapor or fog of the organic solvent fed into the upper space of the container can be maintained and the re-vaporization phenomenon of the organic solvent occurs in such a way that the organic solvent is continuously re-vaporized in repetition from the mixture solution layer formed on the water surface of warm pure water around the exposed object, whereby the organic solvent vapor is in contact to the surface and is then condensed on the surface due to the temperature difference between the vapor and the object surface, for mixing substitution with the attached water. By realizing the re-vaporization of the organic solvent, the amount of the organic solvent to be used per process cycle can be reduced prominently, compared with conventional processes.

2. The vapor of the organic solvent fed into the upper space of the container is kept as it is in vapor, owing to the atmosphere in the container under reduced pressure, which is kept at the preset pressure reduction value within a range of −350 mmHg to −50 mmHg and owing to the thermal energy of the warm pure water within a range of 30 to 65° C., so that the organic solvent vapor can be kept in contact to the surface of the exposed object from the water surface following the lowering of the warm pure water, whereby the vapor is condensed on the object surface due to the temperature difference from the object surface for mixing substitution with the attached water, and whereby the attached water is securely and rapidly removed from the surface of the object, owing to a liquid current from the surface of the object toward the water surface of the warm pure water, the current developing in the mixture solution layer due to the concentration gradient of the organic solvent along the mixture surface location. More specifically, the object can efficiently be processed for drying, due to two actions of mixing substitution with the organic solvent and the liquid current developing in the mixture solution layer, which works to convey the attached water from the surface of the object toward the water surface of the warm pure water.

3. At the process of feeding the vapor or fog of the organic solvent in the upper space of the container, the container is gas discharged under aspiration, so that the vapor or fog of the organic solvent is smoothly introduced into the upper space of the container and the upper space is filled with the organic solvent in a short time. Hence, smooth transfer to subsequent processes is possible. Because the pressure of the container is appropriately reduced via the gas discharge under aspiration, the organic solvent is vaporized at a temperature lower than the boiling point at atmospheric pressure (ambient pressure). Thus, the solvent atmosphere can be prepared in the upper space at a temperature lower than the temperature at ambient pressure, advantageously from the respect of safety.

In accordance with the present invention, thus, the vapor drying process of an object using an organic solvent can be promoted, and the amount of the organic solvent to be used per drying process (per one cycle process) can be reduced prominently, with the resultant cost reduction, so that the treatment method and the treatment system are advantageous from the standpoint of cost. Additionally, an efficient drying process of an object at a high precision is attained, owing to substitution action from mixing substitution with an organic solvent and a liquid current action developing in the mixture solution layer which works to convey the attached water from the surface of the object to the water surface of the warm pure water, whereby the processing time may possibly be shortened, desirably, and a more excellent drying effect can be expected. The present treatment method and the treatment system are very innovative.

Having described specific preferred embodiments of the invention with reference to the accompanying drawings, it will be appreciated that the present invention is not limited to those precise embodiments, and that various changes and modifications can be effected therein by one of ordinary skill in the art without departing from the scope and spirit of the invention as defined by the appended claims.

What is claimed is:

1. A method of treating semiconductor wafers including cleaning and drying the wafers in a sealed container comprising the steps:
   a. transferring and vertically placing a plurality of wafers in a container and sealing the container;
   b. feeding a quantity of warm pure water into said sealed container sufficient to completely submerge said plurality of wafers and establish a level of said warm pure water in said sealed container;
   c. feeding a vapor or fog of an organic solvent into at least a space in said sealed container above the level of said warm water;
   d. terminating feeding the vapor or fog of the organic solvent;
   e. drying said plurality of wafers by aspirating the warm water through an outlet in the bottom of the container wherein said pressure in the container is reduced during said aspiration; and
   f. controlling the pressure in said sealed container until said aspiration is complete by continuously feeding an inert gas into the space above the level of said warm pure water in said sealed container during and subsequent to said aspiration to provide a preset reduced pressure in said sealed container.

2. A treatment method of semiconductor wafers according to claim 1,
   wherein the step of feeding the vapor or fog of the organic solvent into the sealed container is carried out while the container is gas discharged under aspiration and the feeding of the vapor or fog of the organic solvent is terminated when the space above the level of warm pure water is filled with the organic solvent.

3. A treatment method of semiconductor wafers according to claim 1, wherein the water temperature of the warm pure water to be fed into the sealed container is within a range of 30 to 65° C. and the preset reduced pressure in the sealed container in the container is within a range of −350 mmHg to −50 mmHg until the liquid discharge of the warm pure water under aspiration is terminated.

4. A treatment method of semiconductor wafers according to claim 1, wherein the preset reduce pressure in the container is kept through the flow control by modifying the feeding rate of inert gas or the liquid discharge rate of the warm pure water.

5. A treatment method of semiconductor wafers according to claim 1, wherein the preset reduce pressure in the container is kept through the flow control by constantly maintaining the feeding rate of inert gas or the liquid discharge rate of the warm pure water.

6. A treatment method of semiconductor wafers according to claim 1, wherein the vapor or fog of the organic solvent fed at least into the space above the warm pure water of the sealed container, is condensed on the water surface of the warm pure water to form a mixture solution layer on the water surface, and the vapor or fog thereof is condensed on the surface of the plurality of wafers following the lowering of the water surface due to the liquid discharge of the warm pure water under aspiration, for displacing the attached water on the surface of the plurality of wafer; wherein the organic solvent is re-vaporized from the mixture solution layer, owing to the constantly maintained preset reduce pressure and the thermal energy of the warm pure water; and wherein the condensation on the surface of the plurality of wafers is continuously repeated while the vapor of the organic solvent floats up around the periphery of the plurality of wafers.

7. A treatment system for semiconductor wafers, which can carry out a series of processes from the cleaning process of a plurality of wafers to the drying process thereof in a sealed container, comprising
   a container in a box form with a bottom and with an opening on the upper side and of a size such that a plurality of sheets of the object can be transferred and placed vertically in parallel arrangement, and additionally with a sealing lid freely opening and closing on the upper opening; a liquid feeding means connected to the bottom side of the container to feed warm pure water into the container at least to a liquid level enough to immerse and sink a plurality of wafers after a water rinsing process of the cleaning process is terminated;
   a liquid discharging means connected at least to the liquid feeding means and the upper side of the container or the bottom side thereof, for liquid discharge under aspiration;
   a solvent feeding means connected to the upper side of the container to feed a vapor or fog of an organic solvent into the container;
   a gas feeding means connected to the upper side of the container, to feed inert gas into the container; a detecting means mounted on the upper side of the container, to detect the pressure reduction in the container;
   a control means connected and arranged between the detecting means and the liquid discharge means or the gas feeding means in order to control the liquid discharge rate of the liquid discharge means or the feeding rate of the gas feeding means on the basis of the pressure reduction output from the detecting means compared with a preset pressure reduction value, so that the pressure reduction in the container is maintained at the preset pressure reduction value at the process of the liquid discharge of the warm pure water under aspiration, until the liquid discharge of the warm pure water under aspiration is completed.

8. A treatment system according to claim 7, wherein the water temperature of the warm pure water during feeding into the container is within a range of 30 to 65° C. and the preset pressure reduction value in the container is within a range of −350 mmHg to −50 mmHg until the completion of the liquid discharge of the warm pure water under aspiration to the outside of the container.

* * * * *